United States Patent
Westmoreland

(10) Patent No.: US 6,544,466 B1
(45) Date of Patent: Apr. 8, 2003

(54) SURFACE MODIFICATION METHOD FOR MOLDS USED DURING SEMICONDUCTOR DEVICE FABRICATION

(75) Inventor: Donald L. Westmoreland, Boise, ID (US)

(73) Assignee: Micron Technology, Boise, ID (US)

( * ) Notice: Subject to any disclaimer, the term of this patent is extended or adjusted under 35 U.S.C. 154(b) by 0 days.

(21) Appl. No.: 09/535,367

(22) Filed: Mar. 24, 2000

Related U.S. Application Data

(62) Division of application No. 09/146,853, filed on Sep. 3, 1998.

(51) Int. Cl.$^7$ ............ B29C 33/58; B29C 33/60; B29C 35/08; B29C 45/14
(52) U.S. Cl. ............ 264/494; 264/496; 264/39; 264/272.13; 264/272.17; 264/338
(58) Field of Search ............ 264/134, 135, 264/272.17, 276, 328.9, 337, 338, 494, 496, 39, 272.11, 272.13; 425/90, 96, 98, 116

(56) References Cited

U.S. PATENT DOCUMENTS

| | | | |
|---|---|---|---|
| 4,686,073 A | * 8/1987 | Koller | 264/102 |
| 4,822,536 A | * 4/1989 | Voinis et al. | 264/272.17 |
| 5,112,025 A | * 5/1992 | Nakayama et al. | 264/338 |
| 5,151,276 A | * 9/1992 | Sato et al. | 425/110 |
| 5,204,126 A | * 4/1993 | Singh et al. | 264/338 |
| 5,219,608 A | * 6/1993 | Aoki et al. | 264/272.17 |
| 5,246,198 A | 9/1993 | Kurihara | 249/114.1 |
| 5,266,222 A | * 11/1993 | Willis et al. | 106/2 |
| 5,316,716 A | * 5/1994 | Sato et al. | 264/338 |
| H1654 H | * 6/1997 | Rounds | 264/511 |
| 5,711,780 A | 1/1998 | Taniguchi | 249/114.1 |
| 5,800,747 A | * 9/1998 | Cavasin | 264/272.17 |
| 5,824,252 A | * 10/1998 | Miyajima | 264/316 |
| 5,846,477 A | * 12/1998 | Hotta et al. | 264/511 |
| 5,861,113 A | * 1/1999 | Choquette et al. | 264/338 |
| 5,891,377 A | * 4/1999 | Libres et al. | 264/272.14 |

OTHER PUBLICATIONS

Cyprien Gay Ludwik Leibler, ON STICKINESS, Nov. 1999 Physics Today, pp. 48–52.
L.E. Stillwagon, et al., ABSTRACT: "Evaluation of several organic materials as planarizing layers for lithographic and etchback processing," Polym. Mater. Sci. Eng. 60, 385–9 (1989).
L.E. Stillwagon, et al., ABSTRACT: "Planarization of substrate topography by spin coating," J. Electrochem. Soc. 134(8A), 2030–7 (1987).
J. Prybyla, ABSTRACT: "Contact Planarization; New Method for Global Planarization in Si VLSI," Advanced Metallization Conference 1998, Oct. 6–8, 1998.
J. Prybyla, et al., ABSTRACT: "Device fabrication involving planarization," European Patent Application No. EP 95–303160.

* cited by examiner

*Primary Examiner*—Angela Ortiz
(74) *Attorney, Agent, or Firm*—Workman, Nydegger & Seeley

(57) ABSTRACT

Surface modifications of a mold used during semiconductor device fabrication provide non-stick characteristics and a mold surface that is resistant to abrasion or wear. Such surface modifications are particularly useful in a mold having a quartz planar surface adapted to contact a photo-curable polymer material applied to a semiconductor wafer surface during a fabrication process. The planar surface of the mold is capable of allowing transmission of ultraviolet light therethrough to cure the polymer material. A non-stick film is formed on the planar surface of the mold by a coating or deposition process in order to modify the mold surface. The non-stick film can be formed of a fluoroalkylsilane compound. or a hard material such as diamond or diamond-like carbon. The non-stick film of diamond or diamond-like carbon provides protection against abrasion or wear on the planar surface of the mold. In addition, the non-stick film of diamond or diamond-like carbon can be fluorine-terminated, or can have a coating layer of a fluoroalkylsilane compound formed thereover.

19 Claims, 3 Drawing Sheets

SURFACE MODIFICATION METHOD FOR MOLDS USED DURING SEMICONDUCTOR DEVICE FABRICATION

RELATED APPLICATIONS

This is a divisional application of U.S. patent application Ser. No. 09/146,853, filed on Sep. 3, 1998, titled Surface Modification of Molds Used During Semiconductor Device Fabrication, which is incorporated herein by reference.

BACKGROUND OF THE INVENTION

1. The Field of the Invention

The present invention relates to methods for manufacturing semiconductor devices. More particularly, the present invention relates to modifying the surface of a mold used for formation of planar surfaces during fabrication of semiconductor devices.

2. The Relevant Technology

During fabrication of semiconductor devices from silicon wafers, various processes are carried out prior to cutting the wafer into individual chips for packaging. At certain stages during fabrication of semiconductor devices, it is necessary to form planarized surfaces on the silicon wafer. Various methods have been developed to carry out the required planarization.

An efficient method of planarizing surface topography on a silicon wafer substrate during semiconductor device fabrication utilizes a photocurable polymer material that is applied to the wafer substrate. The polymer material is pressed against a flat quartz window of a mold, and radiant light energy such as ultraviolet light is directed through the quartz to cure the polymer material, thereby forming a planar surface on the wafer substrate. The cured planarized polymer material can then be removed by a dry etch or chemical mechanical planarization (CMP) until the underlying topography is reached. By carefully choosing the method and application of polymer material removal, the underlying layer, such as an insulating layer of borophosphosilicate glass (BPSG), is removed at the same rate as the polymer material and results in a planar topography of the underlying layer.

A major drawback to the above method is adhesion of the polymer material to the surface of the quartz window when the polymer material is cured by light energy. Various mold release agents have been used in an attempt to alleviate the polymer adhesion problem on the surface of the mold. One mold release agent that has been used is octadecyl trichlorosilane (ODTS). A disadvantage of ODTS is that it must be reapplied to the mold window surface periodically, since this release agent wears off after repeated processing.

Another problem that occurs is that silicon wafers in a production line can have large particles of debris land on the surfaces thereof, such as particles of polysilicon from a broken wafer along the production line. If such debris-laden wafers are pressed against the flat quartz surface of a mold, the quartz surface can be scratched or otherwise damaged. Release agents such as ODTS offer no protection against surface damage of a quartz window by debris on a wafer. Such release agents also provide no protection against surface damage by hard material topography such as tungsten on a wafer.

Various other release agents have been used as surface modifiers. For example, perfluoroalkysilanes have been employed to prevent proteins from sticking to glass in biochemical processes. Another mold release agent that has been used is polytetrafluoroethylene (Teflon) formed on the mold surface as a planar sheet. While this mold release agent has good non-stick capabilities, it does not provide adequate protection against mold surface damage.

Accordingly, improved mold surface modifications are needed which overcome or avoid the above problems.

SUMMARY OF THE INVENTION

The present invention is directed to surface modifications of a mold contact surface used during semiconductor device fabrication. The modified mold surface provides effective non-stick characteristics and a mold surface that is resistant to abrasion or wear. The invention is particularly useful in modifying the planar surfaces of molds such as quartz molds used in forming planar surfaces on wafers during fabrication of semiconductor devices. The mold planar surface is adapted to contact a photocurable polymer material applied to a semiconductor wafer surface during a fabrication process. The mold including the planar surface thereof allows radiant electromagnetic energy such as ultraviolet light to pass therethrough to cure the polymer material placed against the planar surface of the mold.

In one aspect of the invention, a method for modifying a mold surface used during semiconductor device fabrication includes providing a mold having a planar surface as described above adapted to contact a photocurable polymer applied to a semiconductor wafer surface during a fabrication process. The mold surface is modified by forming a non-stick film on the planar surface of the mold, with the non-stick film including a release agent such as a fluoroalkylsilane compound. The non-stick film can be formed by a conventional coating process.

Alternatively, a non-stick film of a hard material such as diamond or diamond-like carbon can be formed on the mold surface, with the non-stick film providing protection against abrasion or wear on the planar surface of the mold. The non-stick film can be formed by various conventional processes such as chemical vapor deposition, plasma vapor deposition, sputtering, and the like. In addition, the non-stick film of diamond or diamond-like carbon can be fluorine-terminated, or can have a film of a fluoroalkylsilane compound formed thereover to provide further enhanced non-stick characteristics to the surface of the mold. For example, a modified mold surface can include a film comprising a protective first layer of a hard material such as diamond or diamond-like carbon deposited on the mold surface, and a non-stick second layer of a fluoroalkylsilane compound formed over the first layer.

In another aspect of the invention, a mold apparatus for use during semiconductor device fabrication is provided having a surface modified as described above such that a non-stick film of a fluoroalkylsilane compound is formed over the planar surface. Alternatively, a non-stick film of a hard material such as diamond or diamond-like carbon is formed over the planar surface of the mold. The non-stick film of diamond or diamond-like carbon can be fluorine-terminated, or can have a film of a fluoroalkylsilane compound formed thereover.

In a further aspect of the invention, a method for planarizing a semiconductor wafer device during fabrication includes providing a mold having a planar surface allowing transmission of radiant electromagnetic energy therethrough. The planar surface is modified with a non-stick film of a fluoroalkylsilane compound or a hard material such as diamond or diamond-like carbon formed thereover, as described above. The planar surface of the mold is contacted with a photocurable polymer material that has been applied to a semiconductor device wafer surface during a fabrication process. The photocurable polymer material which is planarized by pressing against the mold surface is solidified by transmitting radiant electromagnetic energy through the planar surface of the mold while the polymer material contacts the planar surface. The solidified polymer material is then released from the planar surface of the mold to allow further processing of the wafer.

The invention is particularly useful in modifying the surface of a quartz mold having a window that will transmit ultraviolet light therethrough. The mold surface modifications of the invention provide enhanced non-stick characteristics and protection against abrasion or wear on the mold surface.

These and other aspects and features of the present invention will become more fully apparent from the following description and appended claims, or may be learned by the practice of the invention as set forth hereinafter.

BRIEF DESCRIPTION OF THE DRAWINGS

In order to more fully understand the manner in which the above-recited and other advantages and objects of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE INVENTION

Figure 1A:
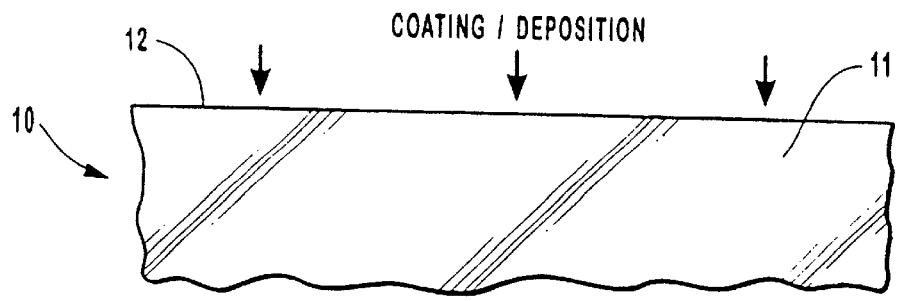
FIGS. 1A–1B are partial side views showing successive steps in modifying the flat surface of a mold apparatus according to the present invention.

The present invention is directed to surface modifications of a mold contact surface used during semiconductor device fabrication. The modified mold contact surface provides effective non-stick characteristics and a mold contact surface that is resistant to abrasion or wear. The contact surface of the mold is modified by forming a non-stick film or layer on the mold contact surface.

The invention is particularly useful in modifying the contact planar surfaces of molds, such as a mold having a quartz window defining a planar surface that is ultraflat and used in forming planar surfaces on wafers during fabrication of semiconductor devices. The planar surface on the quartz window is adapted to contact a photocurable polymer material applied to a semiconductor device wafer surface during a fabrication process. The quartz window is transparent or translucent to radiant electromagnetic energy such as ultraviolet (UV) light. The planar surface of the quartz window is used to press down hard on the photocurable polymer material to obtain a planarized polymer surface on the wafer. The UV light is then directed through the quartz window to cure the polymer material pressed against the quartz window, thereby producing a solidified planar polymer surface on the wafer.

In one embodiment of the intention, the contact surface of a mold is treated or modified with chemical compounds which are fluorinated on the alkyl portion of the chemical structure. Suitable chemical compounds for modifying the mold surface include fluoroalkylsilanes that are long chain fluoroalkyl-halosilanes, such as heptadecafluoro-1,1,2,2-tetrahydrodecyl-trichlorosilane, (heptadecafluoro-1,1,2,2-tetrahydrodecyl)dimethylchlorosi lane, and (tridecafluoro-1,1,2,2-tetrahydrooctyl)trichlorosilane, mixtures thereof, and the like. For example, a non-stick film of a release agent such as a fluoroalkylsilane compound can be formed on a mold planar surface such as a quartz window adapted to contact a photocurable polymer material applied to a semiconductor wafer. The non-stick film can be formed on the mold surface by a conventional coating process. The fluoroalkylsilane compound will bond strongly to the Si—OH terminated surface of the quartz mold window and will produce a very nonpolar modified surface with substantial non-stick characteristics.

In another embodiment of the invention, the contact surface of the mold is treated or modified by forming a non-stick film of a hard material on the contact surface. The non-stick film of hard material is formed by depositing a release material such as diamond or diamond-like carbon (DLC) on the contact surface of the mold.

For example, a non-stick film of hard material can be formed on a mold planar surface such as a quartz window adapted to contact a photocurable polymer material applied to a semiconductor wafer. The non-stick film of diamond or diamond-like carbon can be applied by various deposition processes such as chemical vapor deposition (CVD), plasma vapor deposition (PVD), sputtering, and the like. The diamond-like carbon layer has properties similar to the diamond layer, but is less than 100% diamond. Thus, the diamond-like carbon layer can have other elements incorporated therein such as silicon.

During semiconductor device fabrication, wafers in a production line can have large particles of debris land thereon, such as particles of polysilicon from a broken wafer. If such debris-laden wafers are pressed against the ultraflat quartz window surface of a mold, the quartz surface can be scratched or otherwise damaged. The non-stick film of hard material provides protection against such abrasion or damage because of the very hard diamond or diamond-like carbon layer on the quartz surface of the mold. The non-stick film of diamond or diamond-like carbon on the quartz surface is extremely durable, being resistant to wear or damage and is much harder than the underlying quartz substrate forming the mold surface. This protects the surface of the quartz window, thereby providing damage protection to the quartz window surface.

Further, the diamond or DLC layer has a particularly low coefficient of friction, providing substantial non-stick characteristics to the mold surface. The non-stick characteristics of the diamond or DLC layer can be enhanced by fluorine-terminating the diamond or DLC layer, or by treating the diamond or DLC layer with a fluoroalkylsilane compound. This results in a modified mold surface that is very nonpolar, with excellent non-stick characteristics and extreme resistance to surface damage by hard material topography on silicon wafers.

The non-stick film of diamond or diamond-like carbon can be fluorine-terminated on the outer surface thereof by conventional processes, once the diamond or diamond-like carbon has been deposited on the mold surface. Thus, the non-stick film can be treated with a chemical agent such as $F_2$, $HF/F_2$, $ClF_3$, $IF_7$, or $AgF_2$ to form fluorine terminations on an outer surface of the non-stick film. The fluorine-terminated outer surface provides a highly effective non-stick surface, allowing the cured polymer material abutting the quartz window to be easily removed therefrom.

The non-stick layer of diamond or diamond-like carbon can be treated with a fluoroalkylsilane compound by coating a fluoroalkylsilane compound over the layer of diamond or diamond-like carbon. This provides further enhanced non-stick characteristics to the surface of the mold. For example, a modified mold surface can include a film comprising a protective first layer of a hard material such as diamond or diamond-like carbon deposited on the mold surface, and a non-stick second layer of a fluoroalkylsilane compound formed over the first layer by a coating process.

Figure 1B:
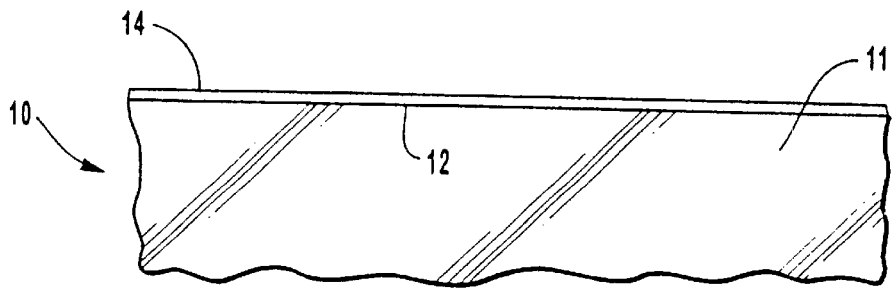

Referring to the drawings, wherein like structures are provided with like reference designations, FIGS. 1A–1B, 2A–2B, and 3A–3B show successive and alternative steps for modifying the surface of a mold apparatus 10 according to the present invention. As shown in FIG. 1A, mold apparatus 10 has a quartz window 11 with outer planar surface 12, which is adapted to contact a photocurable polymer material applied to a semiconductor wafer surface during a fabrication process. The quartz window 11 and planar surface 12 allow radiant electromagnetic energy such as ultraviolet light to pass therethrough to cure the polymer material placed against planar surface 12. The planar surface 12 is modified by a coating or deposition process in order to form a protective non-stick film 14 on planar surface 12, as shown in FIG. 1B. The film 14 can be made of a fluoroalkylsilane compound, or a hard material such as diamond or diamond-like carbon as discussed above, which also allow ultraviolet light to pass therethrough.

Figure 2A:
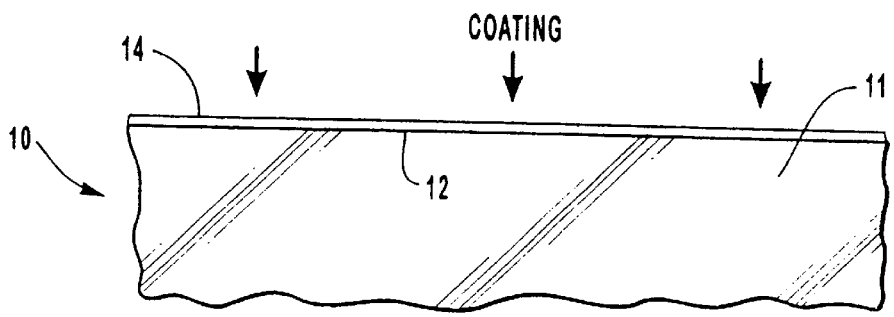
FIGS. 2A–2B are partial side views showing further successive steps in modifying the flat surface of the mold apparatus shown in FIG. 1B according to the present invention.
Figure 2B:
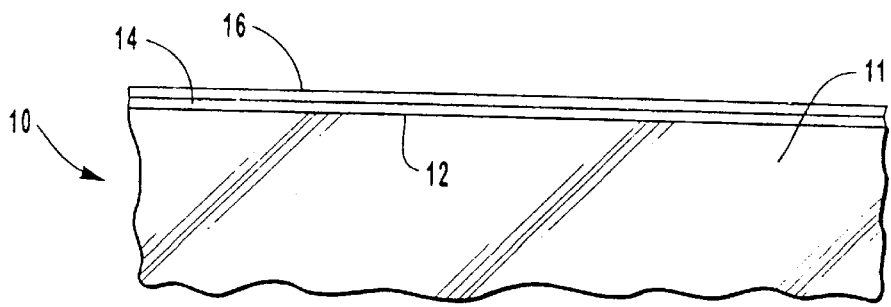
Figure 3A:
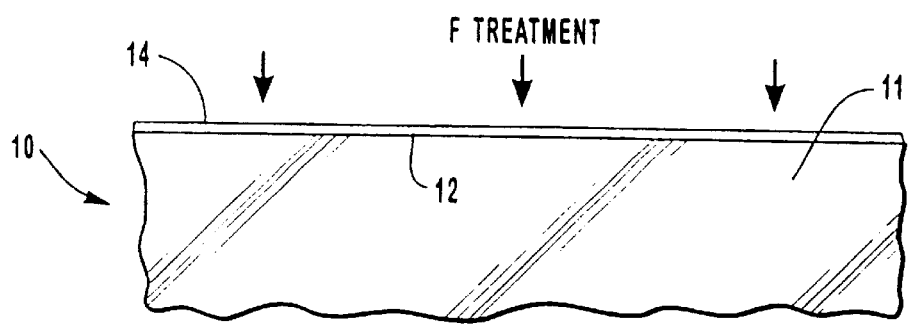
FIGS. 3A–3B are partial side views showing alternative successive steps in modifying the flat surface of the mold apparatus shown in FIG. 1B according to the present invention.
Figure 3B:
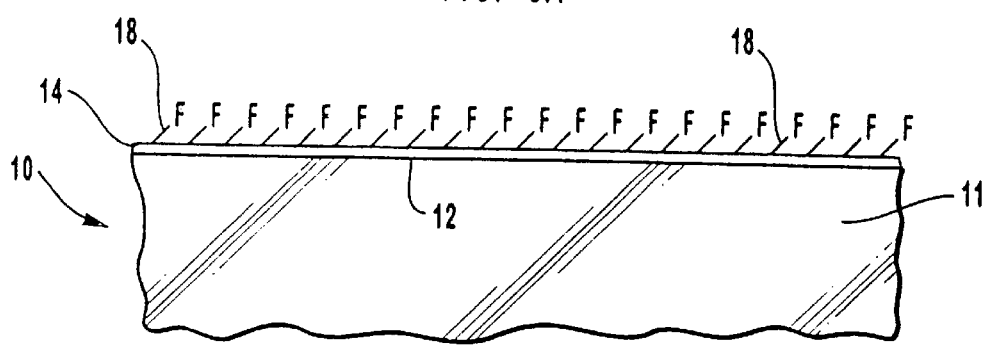

When film 14 is made of diamond or diamond-like carbon, film 14 can be further treated by a coating process as shown in FIG. 2A, in order to form a non-stick layer 16 of a fluoroalkylsilane compound over film 14, as shown in FIG. 2B. Alternatively, when film 14 is made of diamond or diamond-like carbon, film 14 can be further treated by a fluorine treatment process as shown in FIG. 3A. This forms fluorine-terminations 18 on the outer surface of film 14, as shown in FIG. 3B.

Figure 4A:
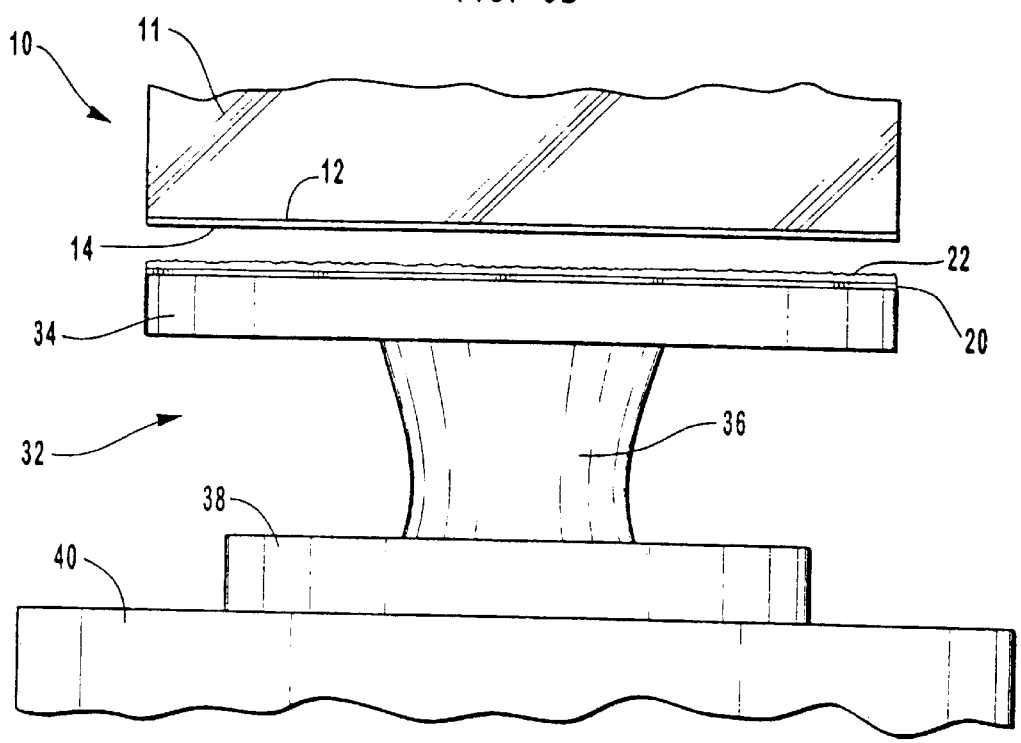
FIGS. 4A–4C are side views showing successive steps in a method for planarizing a polymer layer on a semiconductor wafer using a modified mold surface according to the present invention.
Figure 4B:
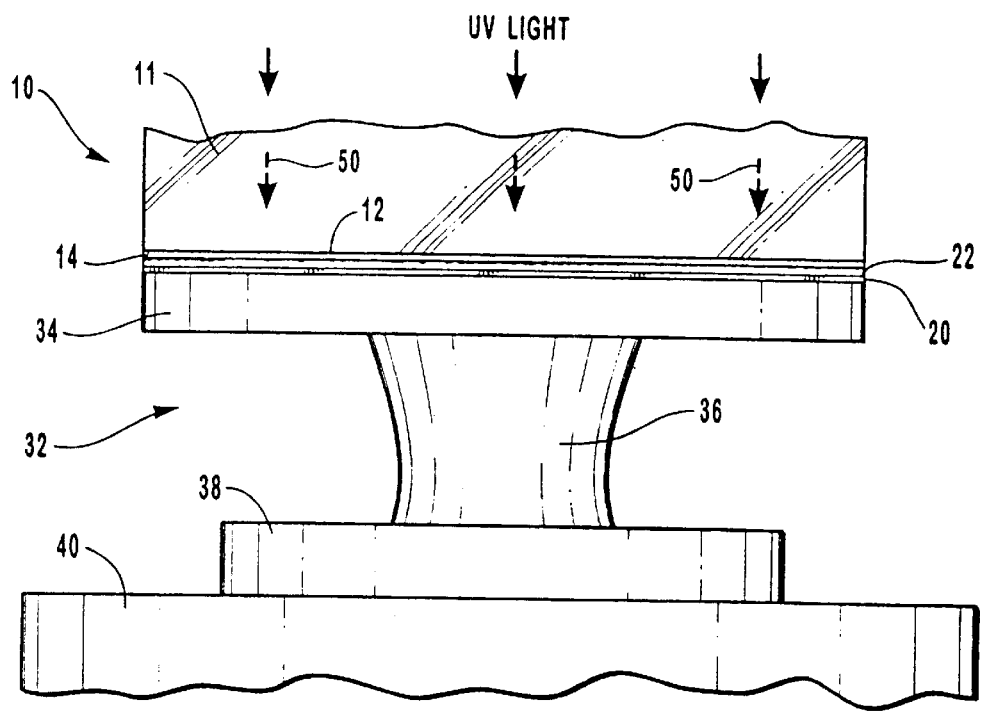
Figure 4C:
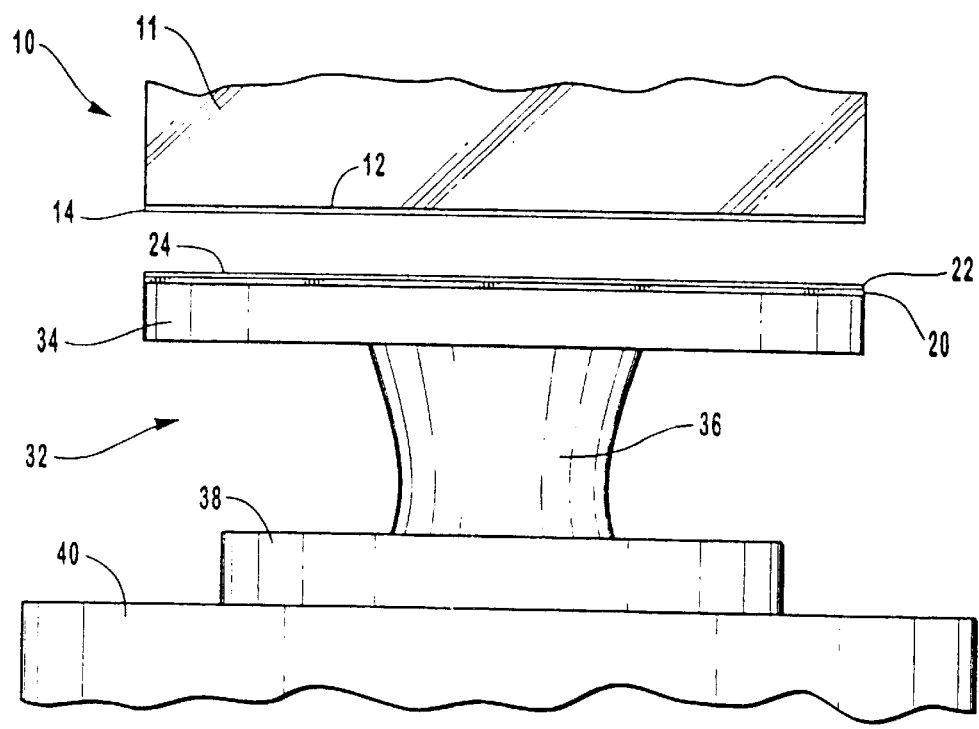

A method for planarizing a semiconductor device during fabrication utilizing a mold having surface modifications according to the present invention is shown in FIGS. 4A–4C.

A mold apparatus 10 having a quartz window 11 with planar surface 12 and film 14 thereover is provided as described above. The mold apparatus 10, quartz window 11, planar surface 12, and film 14 allow transmission of ultraviolet light therethrough. The planar surface 12 is adapted to contact a silicon production wafer 20 having a photocurable polymer layer 22 thereon that has been applied to wafer 20 during a fabrication process. The production wafer 20 is held by a support device 32, which can be a vacuum chuck used to hold wafer 20 in position under mold apparatus 10. The production wafer 20 is held such that polymer layer 22 faces planar surface 12 and film 14 as shown in FIG. 4A. The support device 32 has a top portion 34, such as a chuck top which supports wafer 20, and a z-stage section 36, which is interposed between top portion 34 and a forcer section 38 pressed against a platen 40. The forcer section 38 moves z-stage section 36 and has the ability to compensate for any unevenness of wafer 20.

As shown in FIG. 4B, wafer 20 is pressed against planar surface 12 of mold apparatus 10 such that polymer layer 22 is pressed flat against planar surface 12. A source of radiant light energy (not shown) directs ultraviolet light 50 through quartz window 11 and planar surface 12 in order to solidify polymer layer 22 pressed against planar surface 12. Once polymer layer 22 is solidified, mold apparatus 10 is removed from wafer 20 as shown in FIG. 4C, with polymer layer 22 being easily released from planar surface 12 because of film 14. The solidified polymer layer 22 has a planarized outer surface 24. The wafer 20 can then be further processed according to conventional procedures.

The protective non-stick film of the invention has the advantage of bonding strongly to the quartz surface of a mold apparatus used during semiconductor device fabrication. This allows the protective non-stick film to provide lasting release characteristics and resistance to abrasion or wear on the mold surface.

Although the mold surface-modifying techniques of the present invention have been described in relation to flat quartz-type molds used during semiconductor device fabrication the surface-modifying techniques of the invention can be used in other types of molds where non-stick characteristics and mold surface protection is desired.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method for modifying a mold surface used during semiconductor device fabrication, the method comprising:

providing a mold having a planar surface adapted to contact a photocurable polymer material applied to a semiconductor device wafer during a fabrication process, the mold adapted to allow transmission of radiant electromagnetic energy therethrough to cure the polymer material;

forming a non-stick film on the planar surface of the mold, the non-stick film providing protection against abrasion or wear on the planar surface of the mold, the non-stick film comprising a diamond material; and coating the non-stick film with a release agent comprising a fluoroalkylsilane compound.

2. The method of claim 1, wherein the mold is a quartz mold having a window defining the planar surface that will allow transmission of ultraviolet light therethrough.

3. The method of claim 1, wherein the fluoroalkylsilane compound is a long-chain fluoroalkyl-halosilane.

4. The method of claim 1, wherein the mold is a quartz mold having a window defining the planar surface that will allow transmission of ultraviolet light therethrough.

5. The method of claim 1, wherein the non-stick film is formed by a process selected from the group consisting of chemical vapor deposition, plasma vapor deposition, and sputtering.

6. The method of claim 1, wherein the fluoroalkylsilane compound is a long chain fluoroalkyl-halosilane selected from the group consisting of:

heptadecafluoro-1,1,2,2-tetrahydrodecyl-trichlorosilane;
heptadecafluoro-1,1,2,2-tetrahydrodecyl dimethylchlorosilane;
tridecafluoro-1,1,2,2-tetrahydrooctyl trichlorosilane; and mixtures thereof.

7. A method for modifying a mold surface used during semiconductor device fabrication, the method comprising:
providing a quartz mold having a window with a planar surface adapted to contact a photocurable polymer material applied to a semiconductor device wafer surface during a fabrication process, the mold adapted to allow transmission of ultraviolet light energy therethrough to cure the polymer material;
depositing a release material on the planar surface of the mold to form a non-stick film thereon, the non-stick film providing protection against abrasion or wear on the planar surface of the mold, the non-stick film comprising a diamond material; and
coating the non-stick film with a release agent comprising a fluoroalkylsilane compound.

8. The method of claim 7, wherein the fluoroalkylsilane compound is a long chain fluoroalkyl-halosilane.

9. The method of claim 7, wherein the fluoroalkylsilane compound is a long chain fluoroalkyl-halosilane selected from the group consisting of:

heptadecafluoro-1,1,2,2-tetrahydrodecyl-trichlorosilane;
heptadecafluoro-1,1,2,2-tetrahydrodecyl dimethylchlorosilane;
tridecafluoro-1,1,2,2-tetrahydrooctyl trichlorosilane; and mixtures thereof.

10. The method of claim 7, wherein the non-stick film is formed by a process selected from the group consisting of chemical vapor deposition, plasma vapor deposition, and sputtering.

11. A method for modifying a mold surface used during semiconductor device fabrication, the method comprising:
providing a mold having a planar surface adapted to contact a photocurable polymer material applied to a semiconductor wafer surface during a fabrication process, the mold adapted to allow transmission of ultraviolet light energy therethrough to cure the polymer material;
depositing a release material on the planar surface of the mold to form a non-stick film thereon, the non-stick film providing protection against abrasion or wear on the planar surface of the mold, the non-stick film comprising a diamond material; and
coating the non-stick film with a release agent comprising a fluoroalkylsilane compound.

12. The method of claim 11, wherein the non-stick film is formed by a process selected from the group consisting of chemical vapor deposition, plasma vapor deposition, and sputtering.

13. The method of claim 11, wherein the fluoroalkylsilane compound is a long chain fluoroalkyl-halosilane selected from the group consisting of:

heptadecafluoro-1,1,2,2-tetrahydrodecyl-trichlorosilane;
heptadecafluoro-1,1,2,2-tetrahydrodecyl dimethylchlorosilane;
tridecafluoro-1,1,2,2-tetrahydrooctyl trichlorosilane; and mixtures thereof.

14. A method for modifying a mold surface used during semiconductor device fabrication, the method comprising:
providing a mold having a planar surface adapted to contact a photocurable polymer material applied to a semiconductor wafer surface during a fabrication process, the mold adapted to allow transmission of ultraviolet light energy therethrough to cure the polymer material;
depositing a release material on the planar surface of the mold to form a non-stick film thereon, the non-stick film providing protection against abrasion or wear on the planar surface of the mold, the non-stick film comprising a diamond material; and
treating the non-stick film with a chemical agent to form fluorine terminations on an outer surface of the non-stick film, wherein the chemical agent is selected from the group consisting of $F_2$, $HF/F_2$, $ClF_3$, $IF_7$, and $AgF_2$.

15. The method of claim 10, wherein the non-stick film is formed by a coating process.

16. The method of claim 14, wherein the non-stick film is formed by a process selected from the group consisting of chemical vapor deposition, plasma vapor deposition, and sputtering.

17. A method for planarizing a semiconductor device wafer surface, the method comprising:
providing a mold having a planar surface adapted to transmit radiant electromagnetic energy therethrough, the planar surface having a non-stick film formed thereon comprising a diamond material coated with a fluoroalkylsilane compound;
contacting the planar surface of the mold with a photocurable polymer material applied to a semiconductor device wafer surface such that the polymer material is planarized;
transmitting radiant electromagnetic energy through the planar surface of the mold while the polymer material contacts the planar surface to solidify the polymer material; and
releasing the solidified polymer material from the planar surface of the mold.

18. The method of claim 17, wherein the fluoroalkylsilane compound is a long chain fluoroalkyl-halosilane selected from the group consisting of:

heptadecafluoro-1,1,2,2-tetrahydrodecyl-trichlorosilane;
heptadecafluoro-1,1,2,2-tetrahydrodecyl dimethylchlorosilane;
tridecafluoro-1,1,2,2-tetrahydrooctyl trichliorosilane; and mixtures thereof.

19. A method for planarizing a semiconductor device wafer surface, the method comprising:
providing a mold having a planar surface adapted to transmit radiant electromagnetic energy therethrough, the planar surface having a non-stick film formed thereon comprising a diamond material, wherein the non-stick film has been treated with a chemical agent to form fluorine terminations on an outer surface of the non-stick film, the chemical agent selected from the group consisting of $F_2$, $HF/F_2$, $ClF_3$, $IF_7$, and $AgF_2$;
contacting the planar surface of the mold with a photocurable polymer material applied to a semiconductor device wafer surface such that the polymer material is planarized;

transmitting radiant electromagnetic energy through the planar surface of the mold while the polymer material contacts the planar surface to solidify the polymer material; and releasing the solidified polymer material from the planar surface of the mold.

* * * * *

UNITED STATES PATENT AND TRADEMARK OFFICE
CERTIFICATE OF CORRECTION

PATENT NO. : 6,544,466 B1 Page 1 of 1
DATED : April 8, 2003
INVENTOR(S) : Donald L. Westmoreland It is certified that error appears in the above-identified patent and that said Letters Patent is hereby corrected as shown below:

Column 4,
Line 9, change "intention" to -- invention --
Line 16, change "dimethylchlorosi lane," to -- dimethylchlorosilane, --

Signed and Sealed this

Twelfth Day of August, 2003

JAMES E. ROGAN
*Director of the United States Patent and Trademark Office*